United States Patent
Hu

(10) Patent No.: US 6,751,110 B2
(45) Date of Patent: Jun. 15, 2004

(54) STATIC CONTENT ADDRESSABLE MEMORY CELL

(75) Inventor: Shane Ching-Feng Hu, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 95 days.

(21) Appl. No.: 10/094,574

(22) Filed: Mar. 8, 2002

(65) Prior Publication Data

US 2003/0169612 A1 Sep. 11, 2003

(51) Int. Cl.[7] .............................................. G11C 15/00
(52) U.S. Cl. ..................... 365/49; 365/149; 365/156; 365/203; 365/154; 711/108
(58) Field of Search ..................... 365/49, 149, 156, 365/203, 154; 711/108

(56) References Cited

U.S. PATENT DOCUMENTS

| | | | | |
|---|---|---|---|---|
| 5,111,427 A | * | 5/1992 | Kobayashi et al. | 365/185.07 |
| 5,130,945 A | * | 7/1992 | Hamamoto et al. | 365/49 |
| 5,740,097 A | * | 4/1998 | Satoh | 365/49 |
| 6,147,891 A | * | 11/2000 | Nataraj | 365/49 |
| 6,154,384 A | * | 11/2000 | Nataraj et al. | 365/49 |
| 6,181,591 B1 | * | 1/2001 | Miyatake et al. | 365/49 |
| 6,188,594 B1 | * | 2/2001 | Ong | 365/49 |
| 6,373,738 B1 | * | 4/2002 | Towler et al. | 365/49 |
| 6,430,073 B1 | * | 8/2002 | Batson et al. | 365/49 |
| 6,483,733 B2 | * | 11/2002 | Lines et al. | 365/49 |
| 6,538,947 B2 | * | 3/2003 | Ahmed et al. | 365/207 |
| 2002/0044475 A1 | * | 4/2002 | Lines et al. | 365/49 |
| 2002/0067632 A1 | * | 6/2002 | Batson et al. | 365/49 |
| 2002/0181264 A1 | * | 12/2002 | Yanagawa | 365/49 |
| 2003/0097605 A1 | * | 5/2003 | Sharma et al. | 714/1 |
| 2003/0137890 A1 | * | 7/2003 | Vlasenko et al. | 365/207 |

OTHER PUBLICATIONS

Ikenaga, T. et al., *A Fully Parallel 1–Mb CAM LSI for Real–Time Pixel–Parallel Image Processing*, IEEE Journal of Solid–State Circuits, vol. 35, No. 4, Apr. 2000, pp. 536–544.

Lines, V. et al., *66MHz 2.3M Ternary Dynamic Content Addressable Memory*, IEEE, May 2000, pp. 101–105.

Mundy, J. L. et al., *Low–Cost Associative Memory*, IEEE Journal of Solid–State Circuits, vol. SC–7, No. 5, Oct. 1972, pp. 364–369.

Shafai, F. et al., *Fully Parallel 30–MHz, 2.5–Mb CAM*, IEEE Journal of Solid–State Circuits, vol. 33, No. 11, Nov. 1998, pp. 1690–1696.

Tamura, L. R. et al., *A 4–ns BiCMOS Translation–Lookaside Buffer*, IEEE Journal of Solid–State Circuits, vol. 25, No. 5, Oct. 1990, pp. 1093–1101.

* cited by examiner

*Primary Examiner*—Viet Q. Nguyen
(74) *Attorney, Agent, or Firm*—Dorsey & Whitney LLP

(57) ABSTRACT

A static content addressable memory (CAM) cell. The CAM cell includes a latch having complementary data nodes capacitively coupled to ground, first and second access transistors, each coupled between a data node of the latch and a respective data line. The gates of each access transistor is coupled to a word line such that when activated, the respective data node and data line are coupled. The CAM cell further includes a match circuit coupled to one of the complementary data nodes of the latch. The match circuit discharges a match line in response to a data value stored at the data node to which the match circuit is coupled and compare data present on the respective data line mismatching. Two of the CAM cells can be used to implement a full ternary CAM cell.

17 Claims, 4 Drawing Sheets

STATIC CONTENT ADDRESSABLE MEMORY CELL

TECHNICAL FIELD

The present invention is related generally to the field of semiconductor memory devices, and more particularly, to static content addressable memory cells and methods for storing data therein.

BACKGROUND OF THE INVENTION

Content addressable memories (CAMs) are used in a variety of applications requiring pattern matching operation on bits, such as virtual memory, data compression, caching, and table lookup applications. With the popularity of high speed networks, wired or wireless, on the rise, CAMs have been frequently employed in networking equipment, particularly routers and switches, computer systems and other systems that require content searching, such as in network-address filtering and translation by matching partial node address. For example, in network router or switch, CAM devices are used to store Internet Protocol (IP) addresses and routing instructions associated with each address. When an IP packet is received and the IP address obtained, the router must retrieve the routing information for the packet in order to send it on the most direct route to the desired IP address. By using a CAM memory device, the router can search the CAM for the desired IP address. That is, the CAM searches for the desired content, and if there is a match, the CAM returns the associated routing information.

CAM devices can store data much like conventional memory devices. Generally, an address is provided by a controller to the CAM device, the address is used to access a particular memory location within the CAM memory array, and then the content stored in the addressed memory location is retrieved from the memory array. However, as previously discussed, CAM devices provide the added functionality of being able to search the stored data for desired content. That is, in addition to simply storing data in its memory array, a CAM device can search the memory array based on compare data corresponding to the desired content. When the content stored in the CAM memory array does not match the compare data, the CAM device returns a no match indication. However, when the content stored in the CAM memory array matches the compare data, the CAM device outputs information associated with the content.

CAM storage cells have been implemented using dynamic random access memory (DRAM) cells, as well as static random access memory (SRAM) cells. One of the benefits of using a DRAM cell structure for CAM cells is that they are smaller in size relative to SRAM cells. However, as with conventional DRAM cells, such designed CAM cells need to be periodically refreshed in order to maintain the integrity of the data, as is well known. CAM devices designed with DRAM cells also require that the rows of the CAM device to be read sequentially, one row at a time, which is prohibitively slow. Moreover, due to the match circuit that is included with CAM cells, there are more leakage paths from the storage node. The techniques used in DRAM cells to reduce transfer gate leakage may not be readily available to CAM cell designs.

As previously mentioned, CAM cells have also been implemented using SRAM cell designs. Although larger in size than DRAM cells, SRAM cells provide the benefit of not needing to be refreshed to maintain data integrity. SRAM cells have been designed with six transistors (6T) as well as four transistors (4T). The 6T SRAM cells provide the benefit of having relatively low soft-error rates. "Soft-errors," as known in the art, are those errors that are typically caused by power supply problems or alpha particles. Although 4T SRAM cells are smaller relative to their 6T counterparts, the 4T SRAM cells have higher soft-error rates. This issue is particularly significant with respect to CAM devices, since the data stored in the CAM memory array essentially represents a database of information. That is, the soft-error rate of conventional 4T SRAM cells may be unacceptable in the application of a CAM device. Consequently, choosing to design a CAM device using a 6T SRAM structure, which, as previously mentioned, are relatively larger, may be an acceptable compromise in light of the more significant issues that arise where the integrity of the data in the CAM cell is questionable.

Accordingly, there is a desire and need for an alternative CAM cell design that is relatively small and yet has acceptably low soft-error rates.

SUMMARY OF THE INVENTION

The present invention is directed to a static content addressable memory (CAM) cell. The CAM cell includes a latch having complementary data nodes capacitively coupled to ground, first and second access transistors, each coupled between a data node of the latch and a respective data line. The gates of each access transistor is coupled to a word line such that when activated, the respective data node and data line are coupled. The CAM cell further includes a match circuit coupled to one of the complementary data nodes of the latch. The match circuit discharges a match line in response to a data value stored at the data node to which the match circuit is coupled and compare data present on the respective data line mismatching. Two of the CAM cells can be used to implement a full ternary CAM cell. In storing data in the CAM cell, a first one of the data nodes is charged and the other data node is coupled to ground. The capacitive coupling of the first data node assists in is maintained the charge state.

DETAILED DESCRIPTION OF THE INVENTION

Embodiments of the present invention are directed to static content addressable memory cells and methods of storing data therein. Certain details are set forth below to provide a sufficient understanding of the invention. However, it will be clear to one skilled in the art that the invention may be practiced without these particular details.

In other instances, well-known circuits, control signals, and timing protocols have not been shown in detail in order to avoid unnecessarily obscuring the invention.

Figure 1:
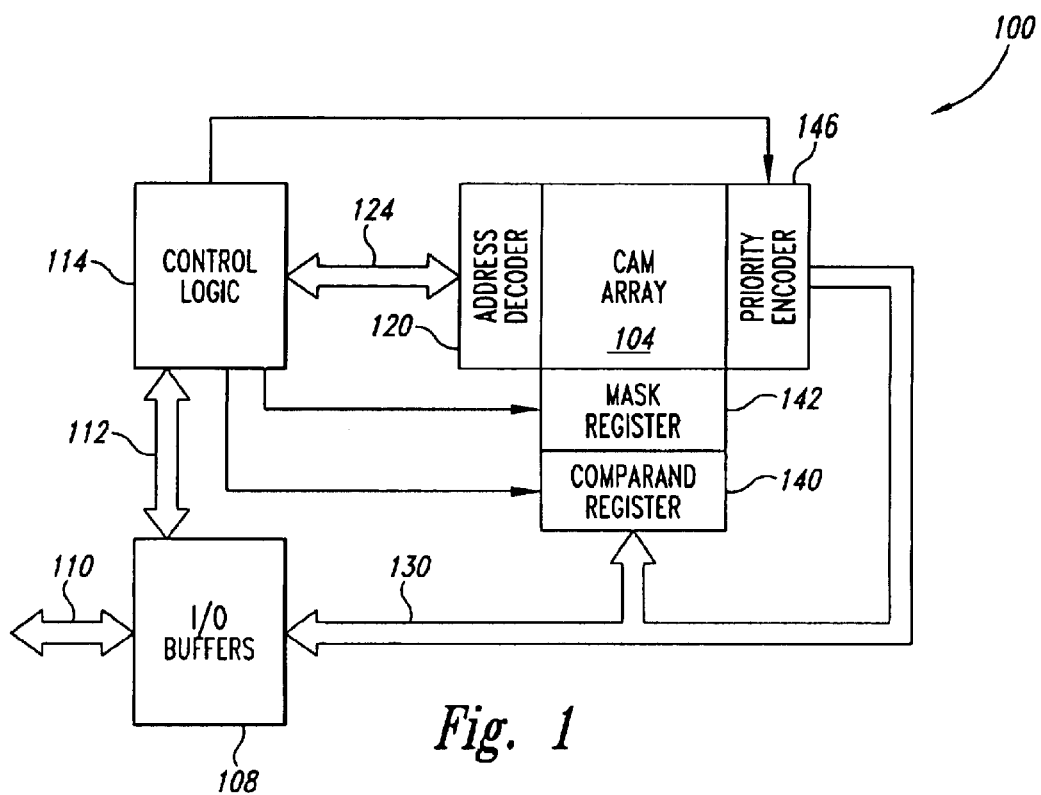
FIG. 1 is a block diagram of a content addressable memory (CAM) device having a CAM array including CAM memory cells according to an embodiment of the present invention

FIG. 1 illustrates a content addressable memory (CAM) 100 having a CAM array 104 that includes CAM memory cells according to an embodiment of the present invention. The content addressable memory 100 further includes an input/output (I/O) buffer 108 that is coupled to a bus 110 on which various data is provided to and from the CAM 100, such as command data, address data, data values, and the like. Data output by the CAM 100 are also provided from the I/O buffer onto the bus 110. The I/O buffer 108 further serves the function of providing the data received to the appropriate block of the CAM 100. For example, command data received at the I/O buffer is provided on a command bus 112 to control logic 114. The command data received by the control logic 114 is then translated into internal timing and data signals that control the functionality of the CAM 100. The control logic 114 may further includes logic circuitry to provide enhanced functionality. Address data provided to the I/O buffer is provided to an address decoder 120 from the control logic 114 on an address bus 124. The address data is decoded and the appropriate rows of memory cells of the CAM array 104 are activated for accessing. Where data is being written to the memory cells of the CAM array 104, data values are provided by the I/O buffer 108 to the CAM array 104 on a data bus 130. Data read from the CAM array 104 is provided on the data bus 130 to the I/O buffer 108.

Where the CAM 100 is commanded to perform a matching operation, compare data values representing the data pattern to match are provided by the I/O buffer on the data bus 130 to a comparand register 140. A mask register 142 is loaded with a mask value that can be used to indicate which bits of the data pattern are significant in the match operation. Upon the control block issuing the appropriate signals, a matching operation is performed that simultaneously compares data stored in the CAM array 104 with the data pattern stored in the comparand register 140. Every row of the CAM array 104 having data matching the data pattern is then provided to a priority encoder block 146 where a matched entry index is generated based on the match results. The matched entry index determined by the priority encoder block 146 is then provided as output data from the CAM 100.

It will be appreciated that the CAM 100 illustrated in FIG. 1 has been provided by way of example, and that the previous discussion was a general description provided for the benefit of the reader. Those of ordinary skill in the art have sufficient understanding of the operation and functionality of CAM devices such that FIG. 1 and the accompanying description is sufficient to enable those of ordinary skill in the art to practice embodiments of the present invention. Consequently, a more detailed description of the CAM 100 has been omitted from herein in the interest of brevity.

Figure 2:
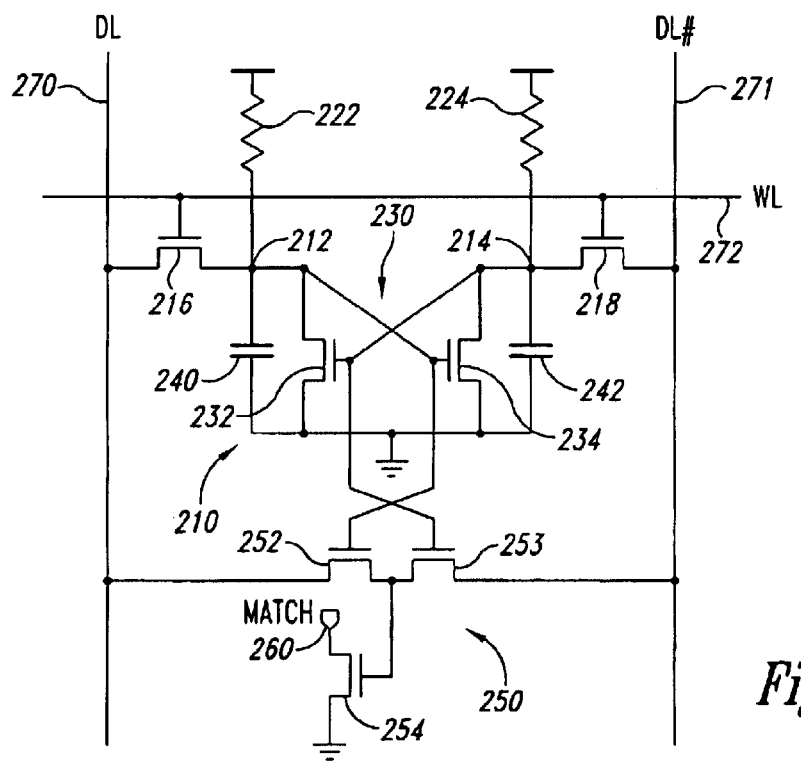
FIG. 2 is a schematic drawing of a CAM memory cell according to an embodiment of the present invention.

FIG. 2 illustrates a CAM memory cell 200 according to an embodiment of the present invention, and which can be used in the CAM array 104 of FIG. 1. The CAM memory cell 200 includes a cell 210 having complementary data nodes 212 and 214 coupled to complementary data lines 270 and 271 through transfer gates 216 and 218, all respectively. Gates of both the transfer gates 216 and 218 are coupled to a word line 272 so that when the word line 272 is activated, the transfer gates 216 and 218 couple the data nodes 212 and 214 to respective data lines 270 and 271. The cell 210 further includes a bistable circuit 230 having cross-coupled transistors 232 and 234 and resistors 222 and 224 coupled to a respective one of the data nodes 212 and 214. The resistors 222 and 224 are also coupled to a power supply to provide charge to the data nodes 212 and 214, and the bistable circuit 230 is further coupled to a ground. The bistable circuit 230 can be set into one of two states to store complementary data at the data nodes 212 and 214. Capacitors 240 and 242 are coupled between a respective one of the data nodes 212 and 214 and ground. As will be explained in more detail below, the capacitors 240 and 242 provide the CAM memory cell 200 with improved soft-error rate and improved data integrity while allowing for a compact CAM memory cell structure.

The CAM memory cell 200 further includes a match circuit 250 coupled to the data nodes 212 and 214. A transistor 252 has a gate coupled to the data node 212 and is used to selectively couple the data line 270 to a gate of a transistor 254. Similarly, a transistor 253 has a gate coupled to the data node 214 and is used to selectively couple the data line 271 to the gate of the transistor 254. The transistor 254 is used to discharge a match line 260 to a LOW logic level, which is indicative of a mismatch of search data applied to the data line 270 and the data stored by the cell 210.

In operation, read and write operations of the CAM memory cell 200 are similar to conventional SRAM memory devices, with the exception that the match line 260 is always held at a LOW logic level during the operation.

To write data to the CAM memory cell 200, the word line 272 is held at a LOW logic level until the data line 270 is precharged to the logical level of an input data bit and data line 271 is precharged to the complement logical level. The voltage of the word line 272 is then raised to activate the transfer gates 216 and 218 to update the stored value at the data nodes 212 and 214, respectively, with the value of the input data bit. The capacitor coupled to the data node having a HIGH logic level applied to it will be charged, and the transistor coupled to the opposite data node will be activated to couple that data node to ground, thereby setting the bistable circuit 230 into one of its two states. The word line is then deactivated to isolate the data nodes 212 and 214 from the data lines 270 and 271 to store the updated value. The charge on the capacitor that is coupled to the data node storing a HIGH logic level will be maintained by the resistive current path from the power supply. By having capacitors 240 and 242 coupled to a respective data node, stored data can be maintained with greater integrity because the charge on the respective data nodes 212 and 214 is less susceptible to variability. Consequently, the cell 210 is more resistant to soft-errors, such as those errors that can be caused by power supply problems or alpha particles, and to which small dimensioned memory cells are particularly susceptible.

To read data from the CAM memory cell 200, the word line 272 is held at a LOW logic level until the data lines 270 and 271 are both precharged. The word line is then activated to couple the data nodes 212 and 214 to the respective data line 270 and 271. The change in the potential of the data lines 270 and 271, due to the charge transfer between the data nodes 212 and 214 and the data lines 270 and 271, is sensed in a conventional manner and amplified to provide output data.

With respect to a match operation for the CAM memory cell 200, the match circuit 250 compares the data stored at the data node 212 to a compare data value provided by the data line 270. In the CAM memory cell 200, the compare data is the complement data value. That is, if the compare data is a LOW logic value, a match will be indicated when a HIGH logic value is stored at the node 212. Generally, the match operation proceeds as follows. The word line 272 is held to a LOW logic level. The match line 260 is precharged to a HIGH logic level and the data line 270 is set to a compare data value. Consequently, the data line 271 is set to the complementary logic level of the data line 270. If there is a mismatch between the compare data value on the data line 270 and the data value stored at the node 212, the match line 260 is discharged to a LOW logic level.

For example, assuming that a LOW logic level is stored at the data node 212 and the compare data value on the data line 270 is a LOW logic level. In this case, the data node 214 is at a HIGH logic level, and the data line 271 is also at a HIGH logic level. Under these conditions, the transistor 253 is ON, coupling the HIGH logic level of the data line 271 to the gate of the transistor 254. The conductive state of the transistor 254 provides a current path to ground through which the match line 260 is discharged from its precharged state. Where the data node 212 is at a LOW logic level, and the data line 270 is at a HIGH logic level, although the transistor 253 is switched ON, the match line 260 remains at a HIGH logic level because the data line 271 is at a LOW logic level, thus, the transistor 54 remains OFF.

Figure 3:
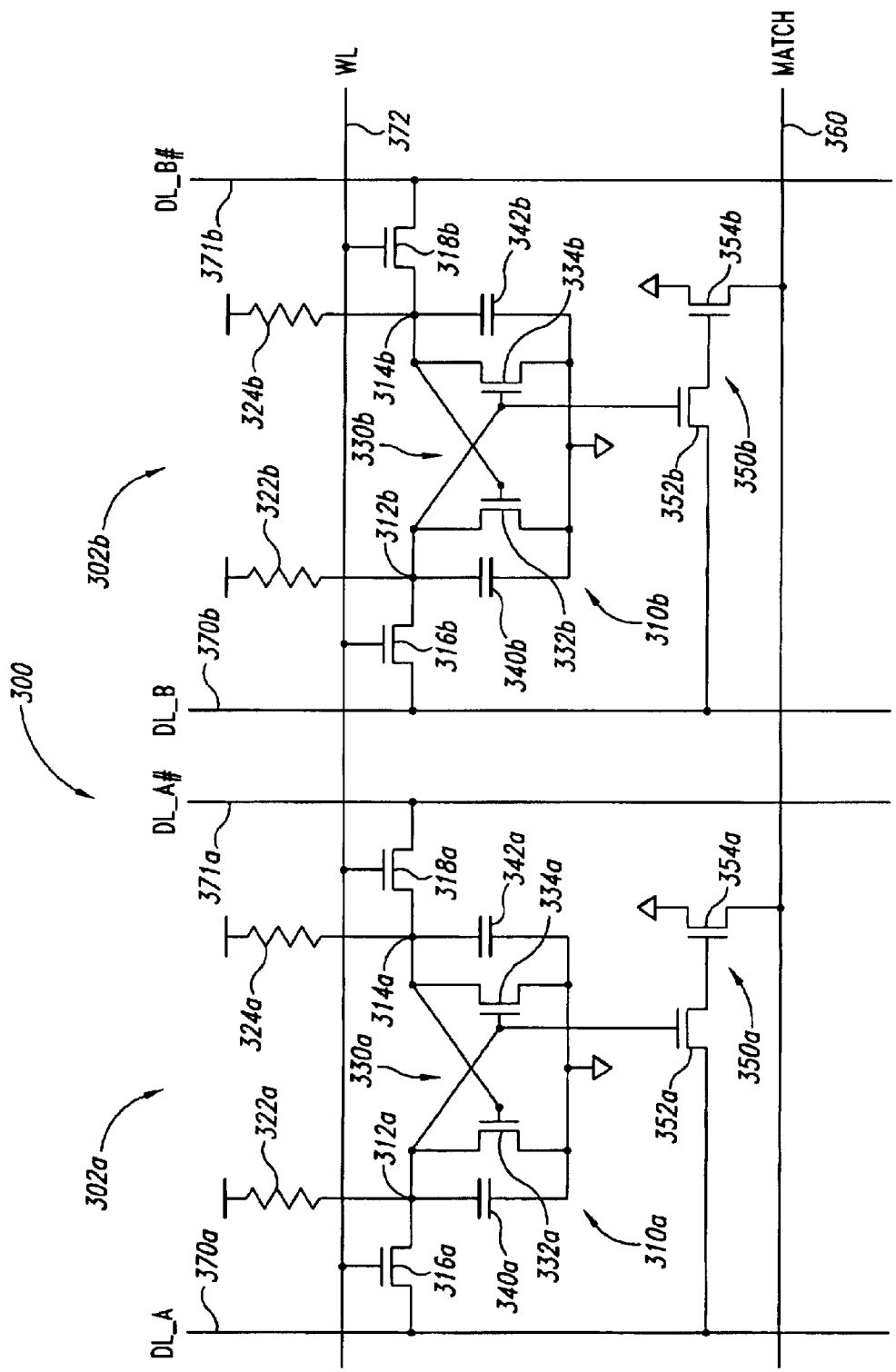
FIG. 3 is a schematic drawing of a CAM memory cell according to an alternative embodiment of the present invention.

FIG. 3 illustrates a CAM memory cell 300 according to an alternative embodiment of the present invention. The CAM memory cell 300 is a full-ternary CAM memory cell having three different match conditions: match, mismatch, and "don't care." The CAM memory cell 300 implements the following truth table:

| 370a, DL_A | 371a, DL_B | 312a, CELL_A | 312b, CELL_B | 360, MATCH |
|---|---|---|---|---|
| X | X | 0 | 0 | 1 |
| 0 | 0 | X | X | 1 |
| 1 | 0 | 0 | 1 | 1 |
| 0 | 1 | 1 | 0 | 1 |
| 1 | 0 | 1 | 0 | 0 |
| 0 | 1 | 1 | 1 | 0 |
| 0 | 1 | 0 | 1 | 0 |
| 1 | 0 | 1 | 1 | 0 |
| 1 | 1 | 0 | 1 | 0 |
| 1 | 1 | 1 | 0 | 0 |
| 1 | 1 | 1 | 1 | 0 |

The CAM memory cell 300 includes two CAM subcells 302a and 302b. It will be appreciated that elements that are identical in the CAM subcells 302a and 302b have the same reference number, except that an "a" or "b" has been added to identify to which CAM subcell the element belongs. The following description is made with respect to the CAM subcell 302a, however, it will be appreciated that the description can be applied to the CAM subcell 302b as well.

The CAM subcell 302a includes a cell 310a having complementary data nodes 312a and 314a coupled to complementary data lines 370a and 371a through transfer gates 316a and 318a, all respectively. Gates of both the transfer gates 316a and 318a are coupled to a word line 372 so that when the word line 372 is activated, the transfer gates 316a and 318a couple the data nodes 312a and 314a to respective data lines 370a and 371a. The cell 310a further includes a bistable circuit 330a having cross-coupled transistors 332a and 334a and resistors 322a and 324a coupled to a respective one of the data nodes 312a and 314a. The resistors 322a and 324a are also coupled to a power supply to provide charge to the data nodes 312a and 314a, and the bistable circuit 330a is further coupled to ground. The bistable circuit 330s can be set into one of two states to store complementary data at the data nodes 312a and 314a. Capacitors 340a and 342a are coupled between a respective one of the data nodes 312a and 314a and ground. As will be explained in more detail below, the capacitors 340a and 342a provide the CAM subcell 302a with improved soft-error rate and improved data integrity while allowing for a compact CAM memory cell structure.

The read and write operations for the CAM memory cell 300 are similar to read and write operations previously described with respect to the CAM memory cell 200, and will not repeated here in the interest of brevity.

With respect to a match operation for the CAM memory cell 300, the match circuit 350a and 350b compare the data stored at the data nodes 312a and 312b, respectively, to compare data values provided by the data lines 370a and 370b. For the CAM memory cell 300, the compare data is the complement of the data value stored at the respective data node. That is, if the compare data is a LOW logic value for the data line 370a and a HIGH logic value for the data line 370b, a match will be indicated when a HIGH logic value is stored at the node 312a and a LOW logic value is stored at the node 312b. Generally, in operation the word line 372 is held to a LOW logic level for the match operation. The match line 360 is precharged to a HIGH logic level and the data lines 370a and 370b are set to a compare data value. The data lines 371a and 371b are not used during the match operation. As will be explained in more detail below, the logic level of the match line 360 following the comparison of the compare data values and the stored data is indicative of the match condition, that is, whether there is a match or don't care, or a mismatch.

With the CAM memory cell 300, there are two don't care conditions with the CAM memory cell 300. That is, whether the stored data and the compare data match or not will not affect the logic level of the match line 360. The first don't care condition exists where the compare data provided to both the data lines 370a and 370b are at a LOW logic level. The second don't care condition exists where the data stored at both the data nodes 312a and 312b, is at a LOW logic level. Thus, to invoke a don't care condition for the CAM memory cell 300, either the compare data or stored data for both CAM subcells 302a and 302b should be at a LOW logic level. In either of the don't care conditions, the match line 360 is maintained at a HIGH logic level. Similarly, where there is a match between the compare data and the stored data for both CAM subcells 302a and 302b, the match line 360 will be kept at a HIGH logic level indicating a match. However, the match line 360 will be discharged to a LOW logic level, indicating a data mismatch, when there is a mismatch between the compare data and the stored data for either of the CAM subcells 302a and 302b. Under these conditions, at least one of the transistors 354a or 354b is activated to discharge the match line 360.

For example, assume that the data condition for the CAM subcells 302a and 302b is "10." That is, the data node 312a is at a HIGH logic level and the data node 312b is at a LOW logic condition. Under this data condition, the transistor 352a is ON and the transistor 352b is OFF. In the event that the compare data condition is "01," the data line 370a is at a LOW logic level and the data line 370b is at a HIGH logic level. As a result, although the transistor 352a is conductive, the match line 360 is not discharged since the transistor 354a remains OFF due to the LOW logic level present on the data line 370a. With respect to the transistor 354b, it remains OFF although the data line 370b is at a HIGH logic level because the transistor 352b is OFF due to the LOW logic level of the data node 312b. Consequently, the match line 360 remains at a HIGH logic level indicating that there is a data match.

In contrast, in the event that the compare data condition is "10," the data line 370a is at a HIGH logic level and the data line 370b is at a LOW logic level. As a result, the transistor 354a is made conductive because the transistor 352a is ON based on the HIGH logic level stored at the node 312a, and the HIGH logic level of the data line 370a is applied to the gate of the transistor 354a to switch it ON. The transistor 354a provides a current path to ground through which the match line 360 is discharged to a LOW logic level, thus indicating a data mismatch. Similarly, where the compare data condition is "11," again the transistor 354a is ON providing a current discharge path to pull the match line 360 to a LOW logic level.

As previously discussed, a don't care condition exists where the data condition is "00" or the compare data condition is "00." In the first case, where the data condition is "00," neither one of the transistors 354a or 354b are conductive because both the transistors 352a and 352b are OFF, thereby isolating the gates of the transistors 354a and 354b from whatever the logic level is on the data lines 370a and 370b. Similarly, in the second case, where the compare data condition is "00," both of the transistors 354a and 354b remain OFF regardless of the data condition because even if one of the transistors 352a or 352b were conductive to couple the data lines 370a and 370b to the gate of a respective transistor 354a or 354b, the LOW logic condition would keep the transistors 354a and 354b OFF. As a result, in either don't care condition, the match line 360 is maintained at a HIGH logic level.

Figure 4:
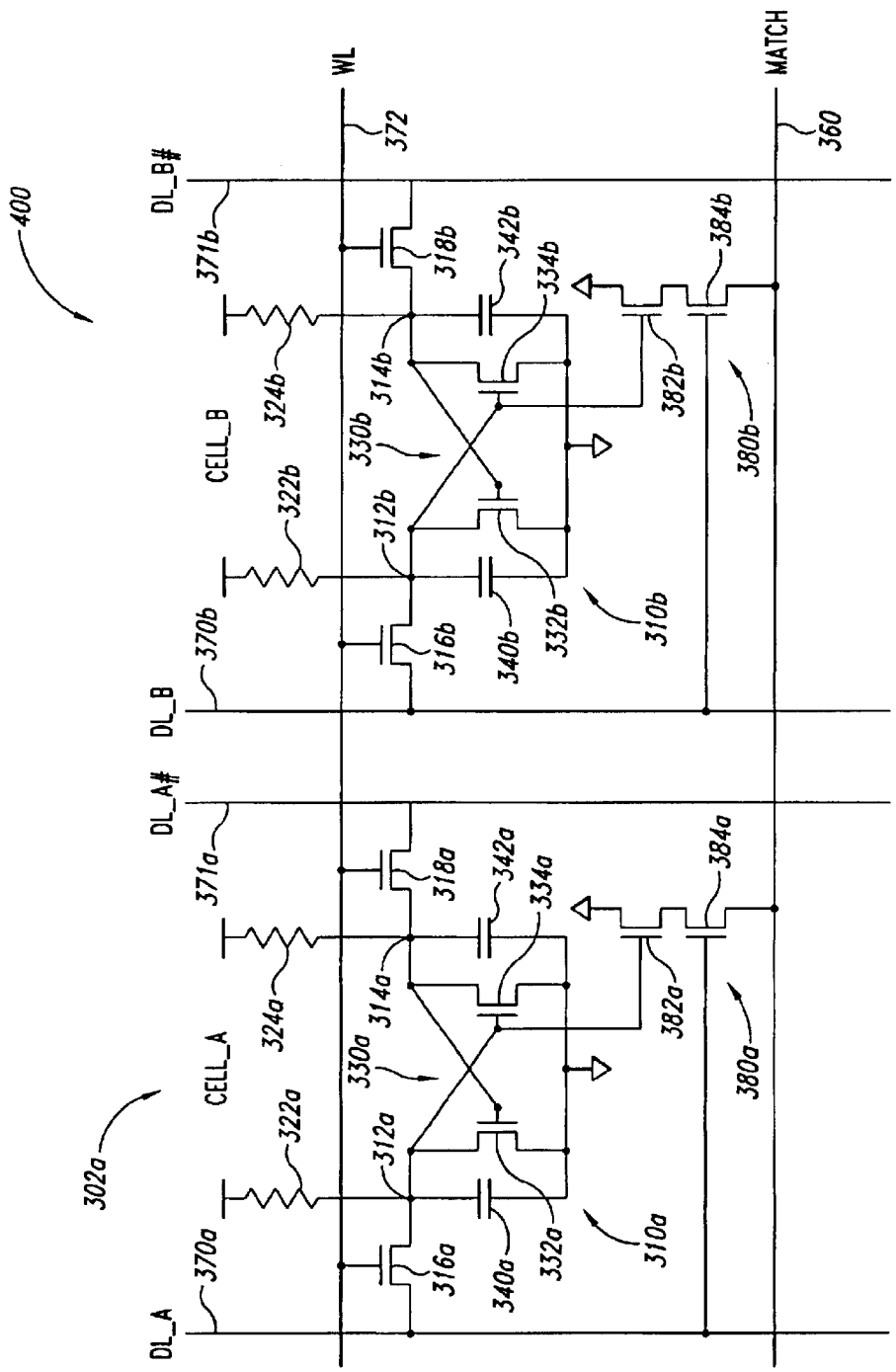
FIG. 4 is a schematic drawing of a CAM memory cell according to an alternative embodiment of the present invention.

FIG. 4 is a CAM memory cell 400 according to another embodiment of the present invention. The CAM memory cell 400 is identical to the CAM memory cell 300 of FIG. 3, except that the match circuits for the two embodiments are different. Similar reference numbers have been used in FIGS. 3 and 4 to indicate similar elements in the CAM memory cell 300 and 400. In the CAM memory cell 400, match circuits 380a and 380b each include a first discharge transistor 382 having a gate coupled to the respective data node, and a second discharge transistor 384 having a gate coupled to the respective data line. The two discharge transistors 382 and 384 provide a current path to ground for the match line to be discharged under the right data and compare data conditions. Operation of the CAM memory cell 400 is the same as for the CAM memory cell 300, as previously described.

Although operation of the CAM memory cells 300 and 400 is nearly the same, the CAM memory cell 300 may provide some advantage over the CAM memory cell 400 with respect to the time to indicate a mismatch. That is, in the CAM memory cell 300, the discharge path through which the match line 360 is discharged to ground, which indicates a data mismatch, is through a single transistor, namely, the transistor 354. In contrast, the discharge path through which the match line 360 is discharged to ground in the CAM memory cell 400 is through two transistors in series, namely, the transistors 382 and 384. Discharging the match line 360 through the two transistors 382 and 384 will generally be slower than discharging the match line through only the one transistor 354. As a result, the matching operation will consequently take longer to complete. However, there may be some benefits from using the CAM memory cell 400, such as greater resistance to current leakage from the match line 360 to ground.

Figure 5:
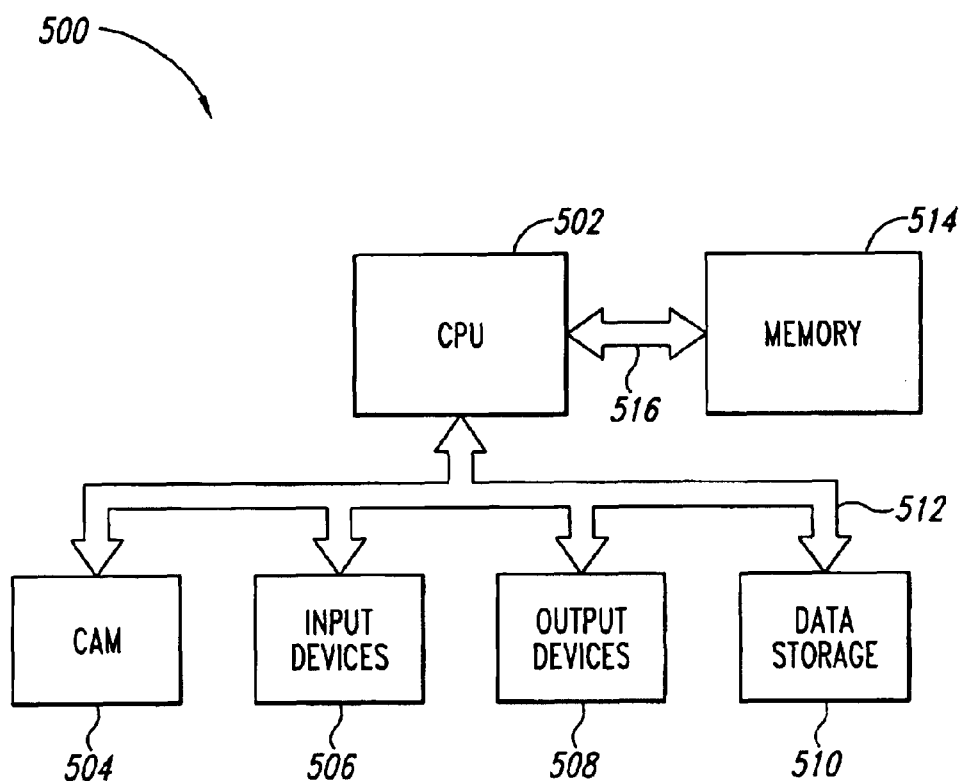
FIG. 5 is a block diagram of a computer system including a content addressable memory device according to an embodiment of the present invention.

FIG. 5 illustrates a processor-based system 500 including a CAM device 504 in accordance with an embodiment of the present invention. The processor-based system 500 represents a system that utilizes a CAM device 504, such as a computer system, a network switch, network router, process control system, or the like. The processor-based system 500 includes a central processing unit (CPU) 502 in communication with the CAM 504 over a bus 512. It will be appreciated that the bus 512 can be representative of a series of buses and bridges commonly used in processor-based systems. However, for the sake of convenience, only the bus 512 has been illustrated in FIG. 5. In addition, the processor-based system 500 includes one or more input devices 506, such as a keyboard or a mouse, coupled to the CPU 502 to allow an operator to interface with the CPU 502. Typically, the processor-based system 500 also includes one or more output devices 508 coupled to the CPU 502. Such output devices typically include printers or a video terminal. One or more data storage devices 510 are also typically coupled to the CPU 502 to store data or retrieve data from external storage media (not shown). Examples of typical storage devices 510 include hard and floppy disks, tape cassettes, and compact disc read-only memories (CD-ROMs). The processor-based system 500 also includes a memory device 514, such as a random access memory (RAM) or a read-only memory (ROM). The CPU 502 is coupled to the memory device 514 through a bus 516, that typically includes appropriate address, data, and control busses to provide for writing data to and reading data from the memory device 502.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In a content addressable memory (CAM) array having CAM cells arranged in rows of word lines and columns of data lines, a CAM cell, comprising:

a bistable circuit coupled to a power supply and ground, the bistable circuit having first and second data nodes;

first and second access transistors coupled to the first and second data nodes and first and second data lines, all respectively, for coupling the respective data node to the respective data line in response to activating a word line;

first and second capacitors, each capacitor having a first terminal coupled to a respective data node and having a second terminal coupled to ground; and a match circuit having a search node coupled to the first data line, a cell node coupled to the first data node, and a match node coupled to a match line, the match circuit changing the logic state of the match line in response to search data provided on the first data line and the data stored at the first data node are mismatching.

2. The CAM array of claim 1 wherein the match circuit comprises:

first and second transistors coupled in series between the first and second data lines, the first transistor having a gate coupled to the first data node and the second transistor having a gate coupled to the second data node; and a discharge transistor coupled between the match line and ground, and having a gate coupled to a node between the first and second transistors.

3. The CAM cell of claim 1 wherein the bistable circuit comprises:

a first switch having a first node coupled to the first data node, a second node coupled to ground, and a control node coupled to the second data node;

a second switch having a first node coupled to the second data node, a second node coupled to ground, and a control node coupled to the first data node; and first and second resistors, each resistor having a first terminal coupled to the power supply and a second terminal coupled to a respective data node.

4. The CAM cell of claim 1 wherein the first and second data nodes store complementary data, and the first and second data lines are a pair of complementary data lines.

5. The CAM cell of claim 1 wherein the search data and the data stored at the first data node are mismatching when the logic level of each are the same.

6. In a content addressable memory (CAM) array having CAM cells arranged in rows of word lines and columns of data lines, a CAM cell, comprising:

a first bistable circuit coupled to a power supply and ground, the first bistable circuit having first and second data nodes;

a second bistable circuit coupled to the power supply and ground, the second bistable circuit having third and fourth data nodes;

first and second access transistors coupled to the first and second data nodes and first and second data lines, all respectively, for coupling the respective data node to the respective data line in response to activating a word line;

second and fourth access transistors coupled to the third and fourth data nodes and third and fourth data lines, all respectively, for coupling the respective data node to the respective data line in response to activating the word line;

first, second, third, and fourth capacitors, each capacitor having a first terminal coupled to a respective data node and having a second terminal coupled to ground; and a match circuit having a first search node coupled to the first data line and a second search node coupled to the third data line, a first cell node coupled to the first data node and a second cell node coupled to the third data node, and a match node coupled to a match line, the match circuit changing the logic state of the match line in response to search data provided on the first data line and the first data node mismatch and search data provided on the third data line and the third data node mismatch.

7. The CAM cell of claim 6 wherein the match circuit comprises first, second, third, and fourth switches, each switch having a control node and first and second nodes, the first switch having its first node coupled to ground and its second node coupled to the match line, and the second switch having its first node coupled to the first data line, its second terminal coupled to the control terminal of the first switch, and its control node coupled to the first data node, and the third switch having its first node coupled to ground and its second node coupled to the match line, and the fourth switch having its first node coupled to the third data line, its second terminal coupled to the control terminal of the third switch, and its control node coupled to the third data node.

8. The CAM cell of claim 6 wherein the match circuit comprises first, second, third, and fourth switches, each switch having a control node and first and second nodes, the first switch having its control terminal coupled to the first data node and its first node coupled to ground, the second switch having its control terminal coupled to the first data line, its first node coupled to the match line, and its second node coupled to the second node of the first transistor, and the third switch having its control terminal coupled to the third data node and its first node coupled to ground, the fourth switch having its control terminal coupled to the third data line, its first node coupled to the match line, and its second node coupled to the second node of the third transistor.

9. The CAM cell of claim 6 wherein the first and second bistable circuits comprise:

a first switch having a first node coupled to a true data node, a second node coupled to ground, and a control node coupled to a not data node;

a second switch having a first node coupled to the not data node, a second node coupled to ground, and a control node coupled to the true data node;

a first resistor having a first terminal coupled to the power supply and a second terminal coupled to the true data node; and a second resistor having a first terminal coupled to the power supply and a second terminal coupled to the not data node.

10. The CAM cell of claim 6 wherein the first and second data nodes store complementary data, the first and second data lines are a pair of complementary data lines, the third and fourth data nodes store complementary data, and the third and fourth data lines are a pair of complementary data lines.

11. The CAM cell of claim 6 wherein the search data and the data stored at the first data node are mismatching when the logic level of each are the same.

12. A content addressable memory (CAM) device, comprising:

an address bus;

a control bus;

a data bus;

an address decoder coupled to the address bus;

a read/write circuit coupled to the data bus; and an array of CAM memory cells coupled to the address decoder, a control circuit, and the read/write circuit, each CAM cell comprising:

a first bistable circuit coupled to a power supply and ground, the first bistable circuit having first and second data nodes;

a second bistable circuit coupled to the power supply and ground, the second bistable circuit having third and fourth data nodes;

first and second access transistors coupled to the first and second data nodes and first and second data lines, all respectively, for coupling the respective data node to the respective data line in response to activating a word line;

second and fourth access transistors coupled to the third and fourth data nodes and third and fourth data lines, all respectively, for coupling the respective data node to the respective data line in response to activating the word line;

first, second, third, and fourth capacitors, each capacitor having a first terminal coupled to a respective data node and having a second terminal coupled to ground; and a match circuit having a first search node coupled to the first data line and a second search node coupled to the third data line, a first cell node coupled to the first data node and a second cell node coupled to the third data node, and a match node coupled to a match line, the match circuit changing the logic state of the match line in response to search data provided on the first data line and the first data node mismatch and search data provided on the third data line and the third data node mismatch.

13. The CAM device of claim 12 wherein the match circuit of the CAM cell comprises first, second, third, and fourth switches, each switch having a control node and first and second nodes, the first switch having its first node coupled to ground and its second node coupled to the match line, and the second switch having its first node coupled to the first data line, its second terminal coupled to the control terminal of the first switch, and its control node coupled to the first data node, and the third switch having its first node coupled to ground and its second node coupled to the match line, and the fourth switch having its first node coupled to the third data line, its second terminal coupled to the control terminal of the third switch, and its control node coupled to the third data node.

14. The CAM device claim 12 wherein the match circuit off the CAM cell comprises first, second, third, and fourth switches, each switch having a control node and first and second nodes, the first switch having its control terminal coupled to the first data node and its first node coupled to ground, the second switch having its control terminal coupled to the first data line, its first node coupled to the match line, and its second node coupled to the second node of the first transistor, and the third switch having its control terminal coupled to the third data node and its first node coupled to ground, the fourth switch having its control terminal coupled to the third data line, its first node coupled to the match line, and its second node coupled to the second node of the third transistor.

15. The CAM device of claim 12 wherein the first and second bistable circuits of the CAM cell comprise:
 a first switch having a first node coupled to a true data node, a second node coupled to ground, and a control node coupled to a not data node;
 a second switch having a first node coupled to the not data node, a second node coupled to ground, and a control node coupled to the true data node;
 a first resistor having a first terminal coupled to the power supply and a second terminal coupled to the true data node; and
 a second resistor having a first terminal coupled to the power supply and a second terminal coupled to the not data node.

16. The CAM device of claim 12 wherein the first and second data nodes of the CAM cell store complementary data, the first and second data lines are a pair of complementary data lines, the third and fourth data nodes store complementary data, and the third and fourth data lines are a pair of complementary data lines.

17. The CAM device of claim 12 wherein the search data and the data stored at the first data node are mismatching when the logic level of each are the same.

* * * * *